United States Patent
Bal et al.

(10) Patent No.: US 10,944,387 B2
(45) Date of Patent: Mar. 9, 2021

(54) PROGRAMMABLE DELAY CIRCUIT

(71) Applicant: STMicroelectronics International N.V., Geneva (CH)

(72) Inventors: Ankur Bal, Greater Noida (IN); Jeet Narayan Tiwari, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/896,463

(22) Filed: Jun. 9, 2020

(65) Prior Publication Data

US 2020/0395926 A1  Dec. 17, 2020

Related U.S. Application Data

(60) Provisional application No. 62/861,630, filed on Jun. 14, 2019.

(51) Int. Cl.
*H03K 5/133* (2014.01)
*H03K 5/1534* (2006.01)
*H03K 3/027* (2006.01)
*H03K 21/08* (2006.01)
*H03K 5/00* (2006.01)

(52) U.S. Cl.
CPC ............ *H03K 5/133* (2013.01); *H03K 3/027* (2013.01); *H03K 5/1534* (2013.01); *H03K 21/08* (2013.01); *H03K 2005/00019* (2013.01)

(58) Field of Classification Search
CPC ...... H03K 5/133; H03K 5/1534; H03K 3/027; H03K 21/08; H03K 2005/00019
USPC ......................................................... 327/263
See application file for complete search history.

(56) References Cited

U.S. PATENT DOCUMENTS

| | | | | |
|---|---|---|---|---|
| 4,637,018 A * | 1/1987 | Flora | .................. | G06F 1/10 327/152 |
| 5,708,381 A * | 1/1998 | Higashisaka | .......... | H03K 5/131 327/276 |
| 5,949,269 A * | 9/1999 | Allen | .................... | H03K 5/135 326/31 |
| 6,026,050 A | 2/2000 | Baker et al. | | |
| 6,137,018 A * | 10/2000 | Ko | .................. | C07C 29/76 568/913 |
| 6,803,826 B2 | 10/2004 | Gomm et al. | | |
| 6,865,121 B1 | 3/2005 | Khanna | | |
| 7,352,837 B2 | 4/2008 | Nelson et al. | | |
| 8,350,612 B2 * | 1/2013 | Cheng | ................ | H03K 17/223 327/264 |
| 10,250,242 B2 * | 4/2019 | He | ................... | H03K 5/15026 |

(Continued)

*Primary Examiner* — Tomi Skibinski
(74) *Attorney, Agent, or Firm* — Crowe & Dunlevy

(57) ABSTRACT

A delay line includes a delay chain, a pulse generator generating a pulse based on a received input signal, and a delay chain control circuit. The delay chain control circuit has a first input receiving the pulse, a second input receiving output from a last element of the delay chain, and a selection input receiving a delayed version of the received input signal. The delay chain control circuit has an output coupled to provide input to a first element of the delay chain in response to the delayed version of the received input signal. An output selection circuit receives outputs from each element of the delay chain, counts assertions of the output of the last element of the delay chain and, in response to the count being equal to a desired count, passes a desired one of the outputs of the elements of the delay chain as output.

25 Claims, 5 Drawing Sheets

(56) References Cited

U.S. PATENT DOCUMENTS

| | | | |
|---|---|---|---|
| 2002/0114416 A1 | 8/2002 | Enam et al. | |
| 2010/0134169 A1* | 6/2010 | Okubo | G11C 7/222 |
| | | | 327/263 |
| 2014/0043105 A1* | 2/2014 | Zerbe | H03K 3/0322 |
| | | | 331/50 |
| 2014/0293710 A1 | 10/2014 | Ware et al. | |
| 2015/0035576 A1* | 2/2015 | Romano | H03K 5/133 |
| | | | 327/262 |

* cited by examiner

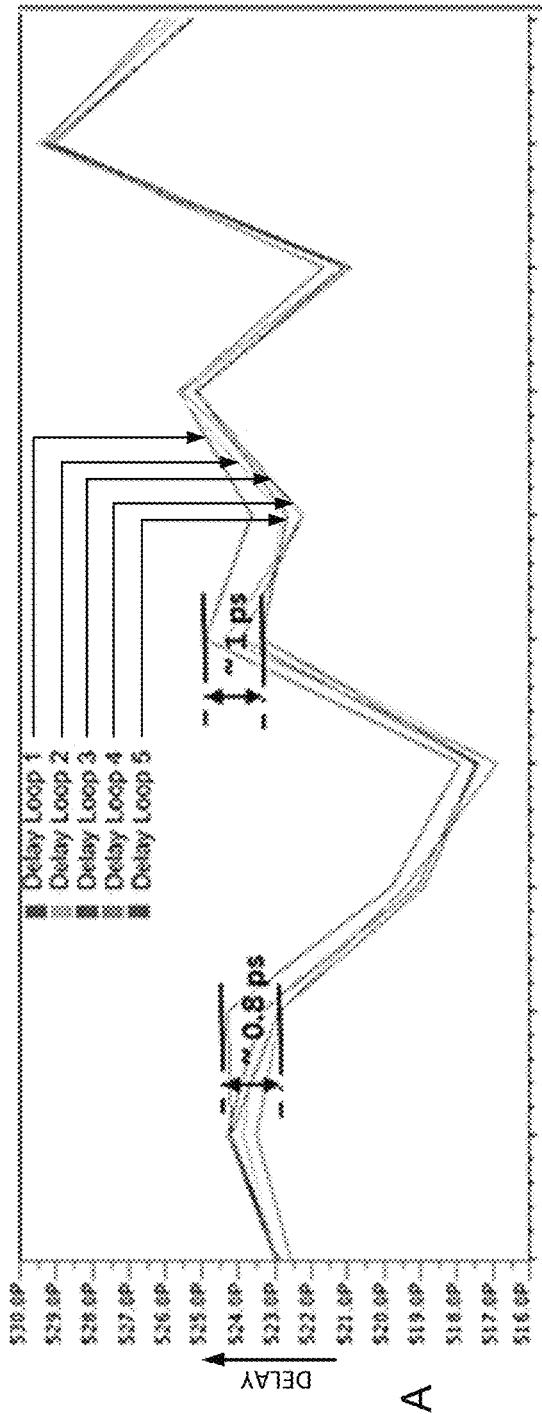
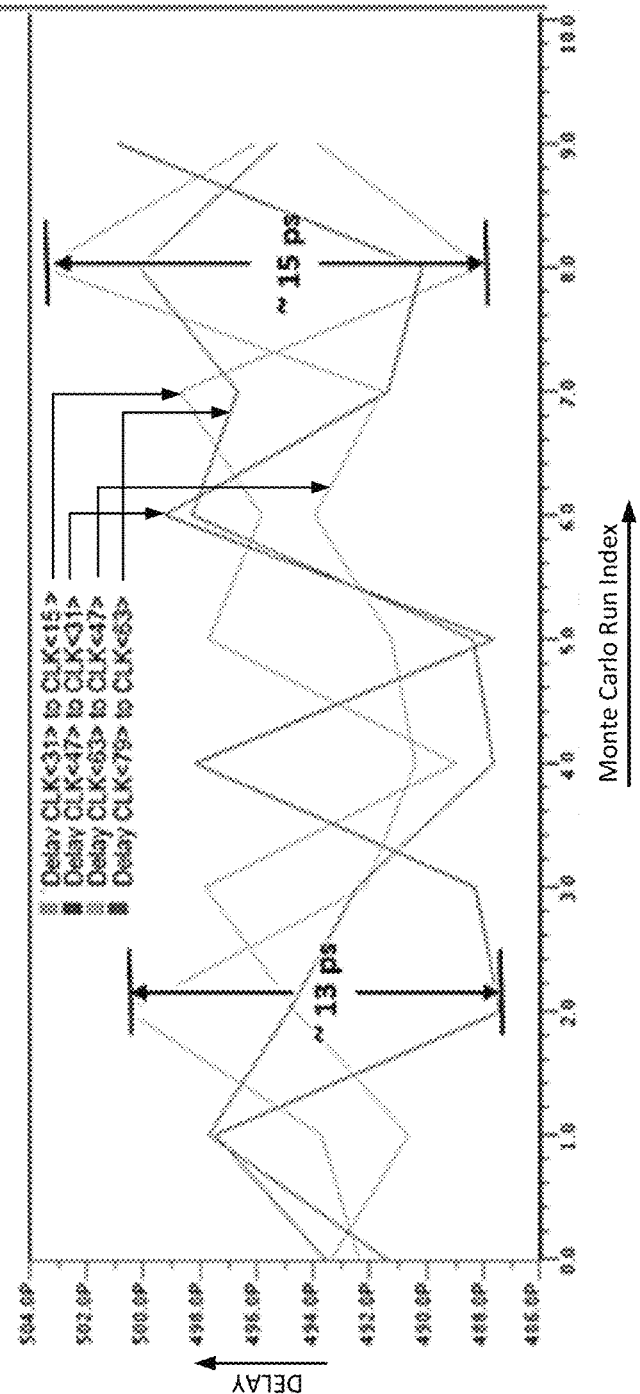
FIG. 4A
FIG. 4B

PROGRAMMABLE DELAY CIRCUIT

RELATED APPLICATION

This application claims priority to U.S. Provisional Patent Application No. 62/861,630, filed Jun. 14, 2019, the contents of which are incorporated by reference to the maximum extent allowable under the law.

TECHNICAL FIELD

This application is directed to the field of programmable delay lines and, in particular, to an efficient programmable delay line using reduced hardware resources over prior art programmable delay lines.

BACKGROUND

Programmable delay line circuits are used in a multitude of applications ranging from Delay Locked Loops (DLLs), Phase Locked Loops (PLLs), critical path replication in digital designs, and process voltage temperature (PVT) variation sensors to name a few. In P. Chen et. al., "A Time-to-Digital-Converter-Based CMOS Smart Temperature Sensor", IEEE Journal of Slid-State Circuits, vol. 40, no. 8, pp. 1642-1648, 2005, as well as in K. Woo, et al., "Dual-DLL-Based CMOS All-Digital Temperature Sensor for Microprocessor Thermal Monitoring," 2009 IEEE International Solid-State Circuits Conference—Digest of Technical Papers, pp. 68-68, 69a, 2009, both incorporated by reference herein, macro level architectures are illustrated where delay circuit elements are used as indicators to monitor and measure temperature parameters to preempt circuit failures.

In Jacek Jasielski, et al., "An Analog dual delay locked loop using coarse and fine programmable delay elements," Proc. 20th International Conference on Mixed Design of Integrated Circuits and Systems, pp. 185-189, Jun. 20-22, 2013, incorporated by reference herein, delay lines are employed in DLL designs.

In Yury Antonov, et al., "Open-loop all-digital delay line with on-chip calibration via self-equalizing delays," Proc. European Conference on Circuit Theory and Design (ECCTD), pp. 1-4, September 2017, as well as in Jaehwa Kwak, Borivoje Nikolic, "A Self-Adjustable Clock Generator With Wide Dynamic Range in 28 nm FDSOI", IEEE Journal of Solid-State Circuits, vol. 51, no. 10, pp. 2368-2379, October 2016, both incorporated by reference herein, it is illustrated how next generation clock generators explicitly use digital delay lines to achieve delay tenability.

Delay circuits also find applications in Time to Digital Conversion (TDC) in: J. Yu, et al., "A 12-bit Vernier ring time-to-digital converter in 0.13 μm CMOS technology," IEEE Journal of Solid-State Circuits, vol. 45, no. 4, pp. 830-842, April 2010; and J. Yu, et al., "A 12-bit Vernier ring time-to-digital converter in 0.13 μm CMOS technology," *IEEE Journal of Solid-State Circuits*, vol. 45, no. 4, pp. 830-842, April 2010, and in optical switch design in M. Moralis-Pegios et al., "Multicast-Enabling Optical Switch Design Employing Si Buffering and Routing Elements," IEEE Photonics Technology Letters, vol. 30, no. 8, pp. 712-715, April 2018, all of which are incorporated by reference herein. These applications deploy the widely used contemporary buffer based delay elements.

While the decrease in the size of transistors formed using modern processes has brought about vast increases in computing power and has allowed great reductions in the physical size of integrated circuits, it has also introduced new design challenges.

In the design of low-power systems utilizing modern sub-micron CMOS based technology, leakage power has become of particular concern. Indeed, in systems where substantial reference or absolute delays are needed (such as those systems described above), the number of delay elements involved is drastically increased. Such delay elements include buffers and inverters designed for sharp transitions to reduce jitter and process sensitivity. This aims to facilitate uniform propagation across each of the delay units in order to be able to accurately quantify the delay produced. In addition to dynamic power dissipation in the buffers, static leakage becomes a problem with the increased number of components.

Another problem seen in newer technologies is delay mismatches due to local and global process variations. With a large number of devices utilized in delay elements and delay circuits, the predictability of the cumulative delay is compromised due to the variation in delay of the buffers. If the number of devices used is limited, the predictability of the delay elements can be improved.

A conventional programmable delay line 1 is now described with reference to FIG. 1, and includes an edge extractor 10, delay chain 13, and selection circuit 14. The edge extractor 10 of the programmable delay line 1 includes an inverter 11 receiving a CLKEDGE signal and providing a complemented version of the CLKEDGE signal to a first input of AND gate 12. The AND gate 12 receives the CLKEDGE signal at its second input, and provides a first clock output CLK<0> at its output. In operation, the edge extractor 10 extracts the rising edge of the CLKEDGE signal, and injects the rising edge into the delay chain 13 as CLK<0>.

The delay chain 13 is comprised of m series connected delay elements 13(1), . . . , 13(m), with m being any integer representing the total number of delayed versions of CLKEDGE that may be selected from to produce the desired output delayed signal CLKOUT. For example, if it desired for the conventional programmable delay line 1 to be able to produce 256 different successively delayed versions of the CLKEDGE signal, then m would be 255. The first delay element 13(1) receives CLK<0> as input. In operation, each delay element 13(1), . . . , 13(m) provides its respective output CLK<1>, CLK<m> to the selection circuit 14, as well as to its immediately successive neighboring delay element.

The selection circuit 14 is comprised of a m×1 multiplexer circuit 15 that receives the output of each of the m delay elements 13(1), . . . , 13(m), receives an a-bit selection signal (with a being equal to the number of binary bits required to provide individual selection between m delay elements), and, in operation, provides a selected (via programming of the a-bit selection signal SEL<a:0>) one of the delay element outputs CLK<1>, . . . , CLK<m> as the output delayed signal CLKOUT.

While this conventional programmable delay line 1 is therefore capable of providing a clock signal delayed by a programmable amount, it has a variety of drawbacks. For example, the selection circuit 15 (due to its large number of inputs) introduces its own delay, which in some cases may be significantly larger than the delay of the delay elements 13(1), . . . , 13(m) themselves, potentially resulting in a lack of monotonicity at the output. In some cases, due to the delays within the selection circuit 15, selection of a larger delay may not even produce a larger delay than the selection of a lesser delay (as the delay within the selection circuit 15 may greatly outweigh the delay provided by the delay elements 13(1), . . . , 13(m)). While this issue can be mitigated or corrected by carefully balancing the components within the selection circuit 15, this can be extremely difficult to achieve, depending on the total number of different delays it is desired for the conventional programmable delay line 1 to be capable of providing.

Other clear drawbacks of the conventional programmable delay line 1 are the consumption of area, as well as high power consumption, since the total number of delay elements 13(1), . . . , 13(m) is to be equal to the total number of delays it is desired for the conventional programmable delay line 1 to be capable of providing. Therefore, this conventional programmable delay line 1 is unsuited for some purposes.

Not much work to date has been done to address the above drawbacks and improve the programmable delay lines used extensively across a gamut of applications. Therefore, further development in the area of programmable delay lines is needed.

SUMMARY

Disclosed herein is a delay line including a delay chain, a pulse generator configured to generate a pulse in response to an edge of a received input signal, and a delay chain control circuit. The delay chain control circuit has a first input receiving the pulse from the pulse generator, a second input receiving output from a last element of the delay chain, and a selection input receiving a delayed version of the received input signal. The delay chain control circuit has an output coupled to provide input to a first element of the delay chain in response to the delayed version of the received input signal. An output selection circuit is configured to receive outputs from each element of the delay chain, count a number of complete passages of the pulse through the delay chain, and in response to the count being equal to a desired count, pass a desired one of the outputs of the elements of the delay chain as output.

The pulse generator may include a first inverter coupled to receive the received input signal and generating a complement of the received input signal, and an AND gate having a first input receiving the received input signal, a second input receiving the complement of the received input signal, and an output generating the pulse.

The delay chain control circuit may include a first multiplexer having a first input receiving the pulse from the pulse generator, a second input receiving output from the last element of the delay chain, and a selection input receiving the delayed version of the received input signal. The first multiplexer may be configured to pass either the pulse or the output from the last element of the delay chain dependent upon a state of the delayed version of the received input signal.

The desired count may be based upon a first selection signal.

The desired one of the outputs of the elements of the delay chain may be based upon a second selection signal.

The desired count may be based upon most significant bits of a selection signal, and the desired one of the outputs of the elements of the delay chain may be based upon least significant bits of the selection signal.

The selection signal may set a total delay of the received input signal provided by the delay chain.

The output selection circuit may include an up-counter receiving output from the output selection circuit as input, the up-counter configured to count assertions of the output from the output selection circuit and assert a selection signal as output in response to the count being equal to the desired count. The output selection circuit may also include an output selection circuit having inputs coupled to receive the output from each element of the delay chain as input, being triggered by assertion of the selection signal, and configured to pass the desired one of the outputs of the elements of the delay chain as output when triggered.

A method aspect disclosed herein is a method of generating a delay. The method includes generating a pulse in response to an edge of a received input signal, injecting the pulse into a delay chain in response to a delayed version of the received input signal having a second logic level, and injecting output of a last element of the delay chain into an input to a first element of the delay chain in response to a delayed version of the received input signal having a first logic level different than the second logic level. The method also includes counting a number of complete traversals of the pulse through the delay chain, and in response to the number of complete traversals of the pulse through the delay chain being equal to a desired count, passing output from a desired element of the delay chain as an output signal.

The method may also include providing a first selection signal representing the desired count.

The method may also include providing a second selection signal representing the desired element of the delay chain.

The method may also include setting the generated delay by setting the desired count and the desired element of the delay chain.

Also disclosed herein is a delay line including a first inverter receiving a clock edge and outputting a complement of the clock edge, an AND gate having a first input receiving the clock edge, a second input receiving the complement of the clock edge, and generating an AND output, and a delay chain containing a plurality of delay elements. The delay line also includes a second inverter receiving the complement of the clock edge and outputting a delayed clock edge, and a first multiplexer having a first input coupled to receive the AND output, a second input coupled to receive output from a last delay element of the delay chain, a control input coupled to receive the delayed clock edge, and an output coupled to a first delay element of the delay chain. The delay line also includes an up-counter having an input coupled to the output of the first multiplexer, a control input coupled to a first select signal, and an output, and a second multiplexer having a plurality of inputs respectively coupled to the plurality of delay elements, a control input coupled to a second select signal, a trigger enable input coupled to the output of the up-counter, and an output providing a delayed signal.

The first select signal may contain most significant bits of a selection word.

The second select signal may contain least significant bits of a selection word.

Also disclosed herein is a delay line including a delay chain, a pulse generator configured to generate a pulse, and a delay chain control circuit. The delay chain control circuit has an input receiving output from a last element of the delay chain, and an output coupled to provide input to a first element of the delay chain. An output selection circuit is configured to receive outputs from each element of the delay chain, count a number of complete passages of a pulse through the delay chain, and pass a desired one of the outputs of the elements of the delay chain as output, based upon the count being equal to a desired count.

The desired count may be based upon a first selection signal.

The desired one of the outputs of the elements of the delay chain may be based upon a second selection signal.

The desired count may be based upon most significant bits of a selection signal, and the desired one of the outputs of the elements of the delay chain may be based upon least significant bits of the selection signal.

The selection signal may set a total delay by the delay chain.

The output selection circuit may include an up-counter receiving output from the output selection circuit as input. The up-counter may be configured to count assertions of the output from the output selection circuit and assert a selection signal as output in response to the count being equal to the desired count. The output selection circuit may also include an output selection circuit having inputs coupled to receive the output from each element of the delay chain as input, being triggered by assertion of the selection signal, and configured to pass the desired one of the outputs of the elements of the delay chain as output when triggered.

Also disclosed herein is a method of generating a delay. The method may include injecting a pulse into a delay chain, injecting output of a last element of the delay chain into an input to a first element of the delay chain, counting a number of complete traversals of the pulse through the delay chain, and in response to the number of complete traversals of the pulse through the delay chain being equal to a desired count, passing output from a desired element of the delay chain as an output signal.

The method may also include providing a first selection signal representing the desired count.

The method may also include providing a second selection signal representing the desired element of the delay chain.

The method may also include setting the generated delay by setting the desired count and the desired element of the delay chain.

BRIEF DESCRIPTION OF THE DRAWINGS

FIGS. 4A-4B show the delay variation across delay lines for the disclosed programmable delay line vs the delay variation across delay lines for the prior art.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Disclosed herein is a programmable delay line that utilizes a limited number n of series connected delay elements to produce desired delays. Due to the design of the programmable delay line, despite utilizing n series connected delay elements each providing a delay of 1/n (and therefore the total delay through the n series connected delay elements is $n*1/n=1$), delays of greater than n can be produced; in prior art systems utilizing n series connected delay elements, the total producible delay is at most equal to n.

Figure 1:
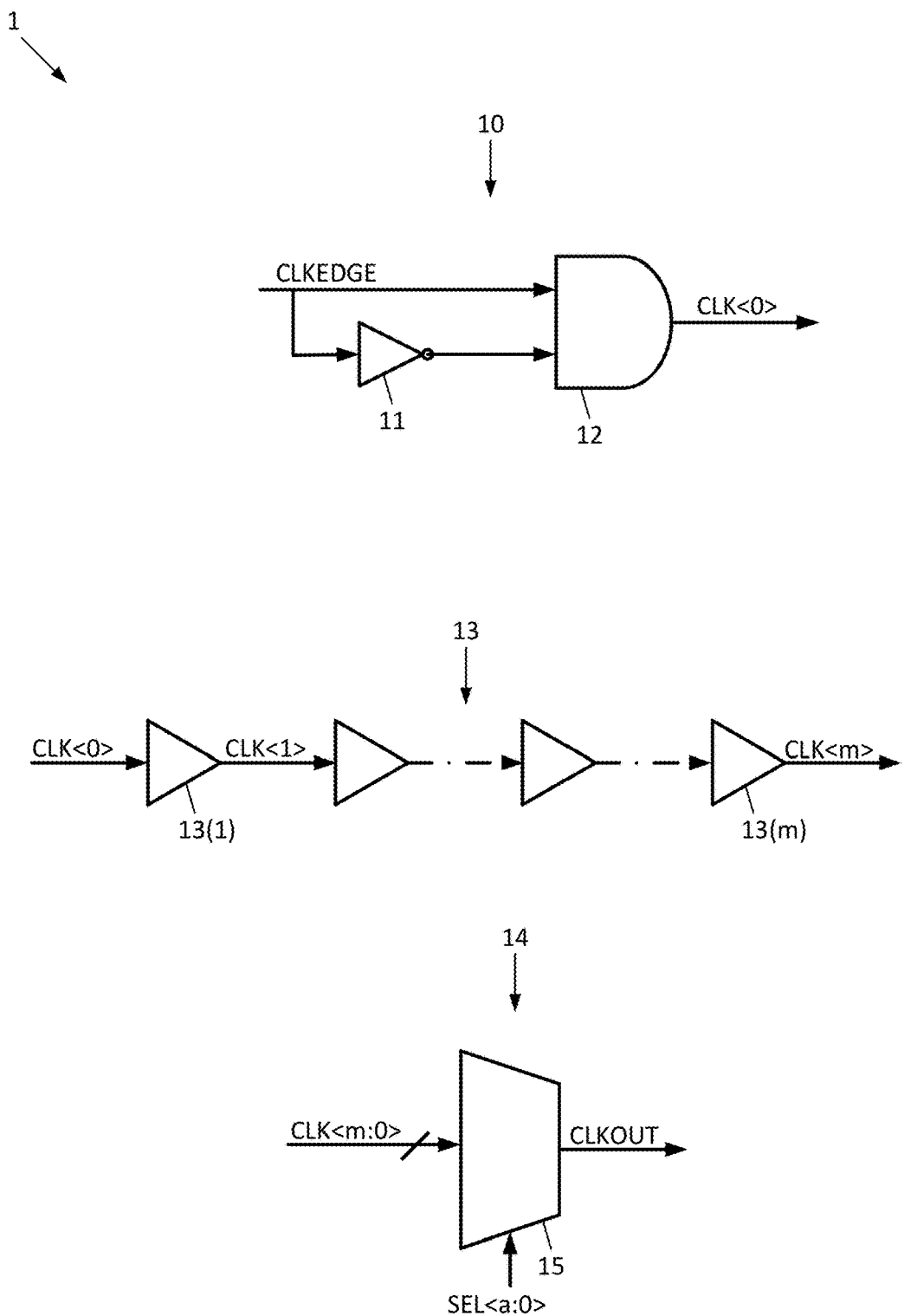
FIG. 1 is a schematic block diagram of a conventional programmable delay line.
Figure 2A:
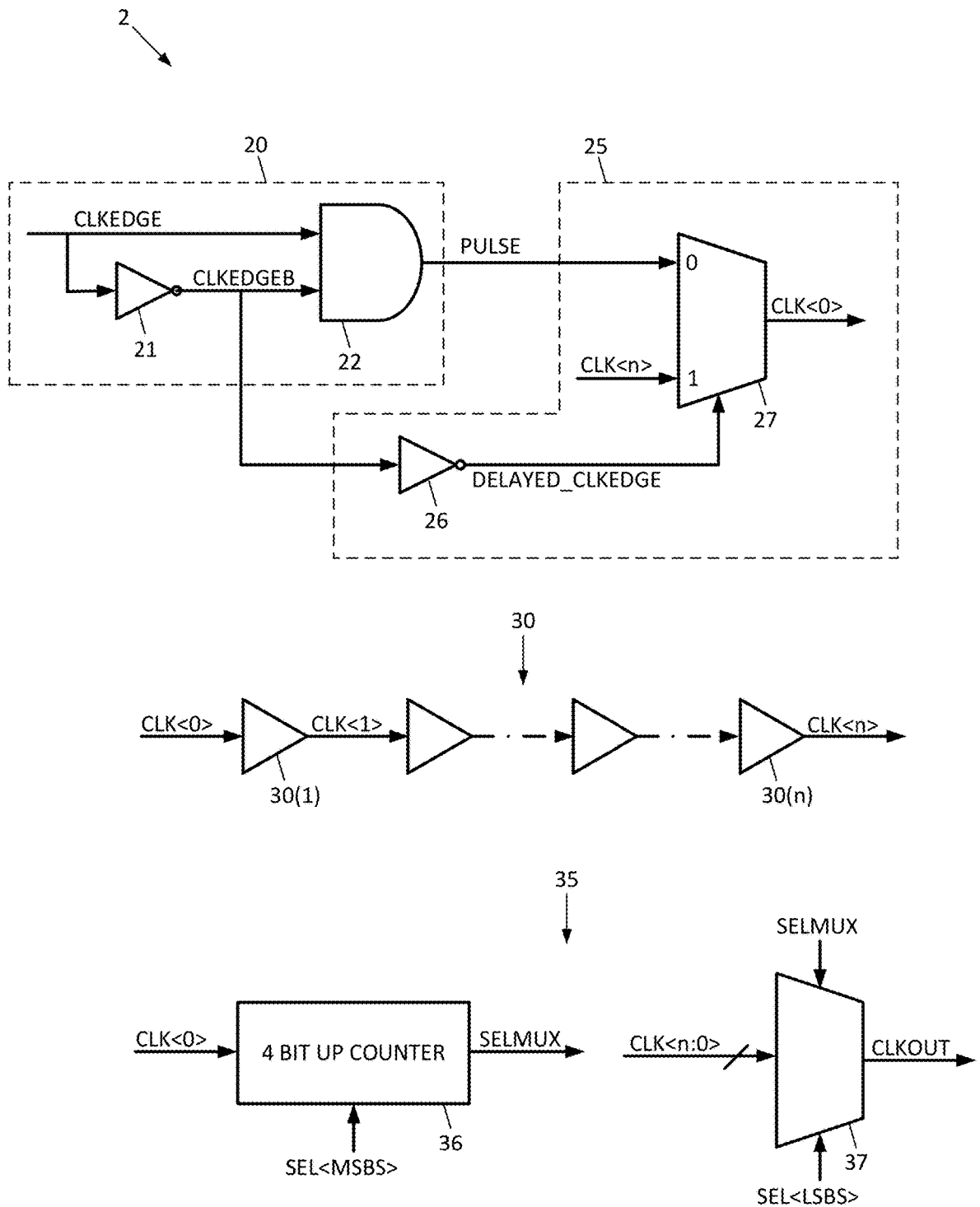
FIG. 2A is a schematic block diagram of a programmable delay line disclosed herein that addresses the drawbacks of conventional programmable delay lines.

The programmable delay line 2 disclosed herein is now described with reference to FIG. 2A. The programmable delay line 2 includes a clock edge extraction circuit 20 (which can also be referred to as a pulse generation circuit), a delay chain control circuit 25, a delay chain 30, and an output selection circuit 35.

The clock edge extraction circuit is comprised of an AND gate 22 having a first input receiving a CLKEDGE signal and a second input receiving a complement CLKEDGEB of the CLKEDGE signal from an inverter 21. The AND gate 22 provides its output to the delay chain control circuit 25.

The delay chain control circuit 25 includes a 2×1 multiplexer 27 having a first input (e.g., a select "0" input) receiving a pulse signal PULSE from the AND gate 22, a second input (e.g., a select "1" input) receiving output from the last element 30(n) of the delay chain 30, and being controlled for selection by a DELAYED CLKEDGE signal received from an inverter 26 (e.g., DELAYED CLKEDGE selects which input of the multiplexer 27 is passed as output), which is a delayed version of the CLKEDGE signal. The multiplexer 27 provides its output to the first element of the delay chain 30.

The delay chain 30 includes n series connected delay elements 30(1), . . . , 30(n) (buffers, for example). The first delay chain element 30(1) of the delay chain 30 receives the output CLK<0> from the multiplexer 27 of the delay chain control circuit 25, and each element 30(1), . . . , 30(n) of the delay chain 30 outputs its own delayed signal CLK<1>, CLK<n>, with the last delay chain element 30(n) of the delay chain 30 outputting CLK<n>.

It is worthwhile to note here that the number of delay elements 30 used is even (in the case where the delay elements are inverters), and therefore the delay chain is inherently stable unlike a ring oscillator which has an odd number of delay elements in its loop (to overcome the loop stability issues). Where the delay elements 30 are buffers, then the total number of delay elements 30 can be even or odd The output selection circuit 35 includes an up-counter 36 receiving the output CLK<0> from the multiplexer 27 of the delay chain control circuit 25, receiving a target count as most significant bits of a SEL digital word, and generating a SELMUX signal as output. An (n+1)×1 multiplexer 37 (with n here being the same number n as denoting the total number of delay elements 30(1), . . . , 30(n) in the delay chain 30) receives each output CLK<n:0> from the delay chain 30 as input, is triggered to switch by the SELMUX signal, and is controlled by last significant bits of the SEL word (e.g., the least significant bits of the SEL word select which input of the multiplexer 37 is passed as output). The output of the multiplexer 37 is the delayed signal CLKOUT.

In operation, the clock edge extraction circuit 20 extracts the rising edge of the CLKEDGE signal to a pulse signal PULSE having a pulse width equal to the aggregate delay time of the inverter 21 and AND gate 22.

Figure 2B:
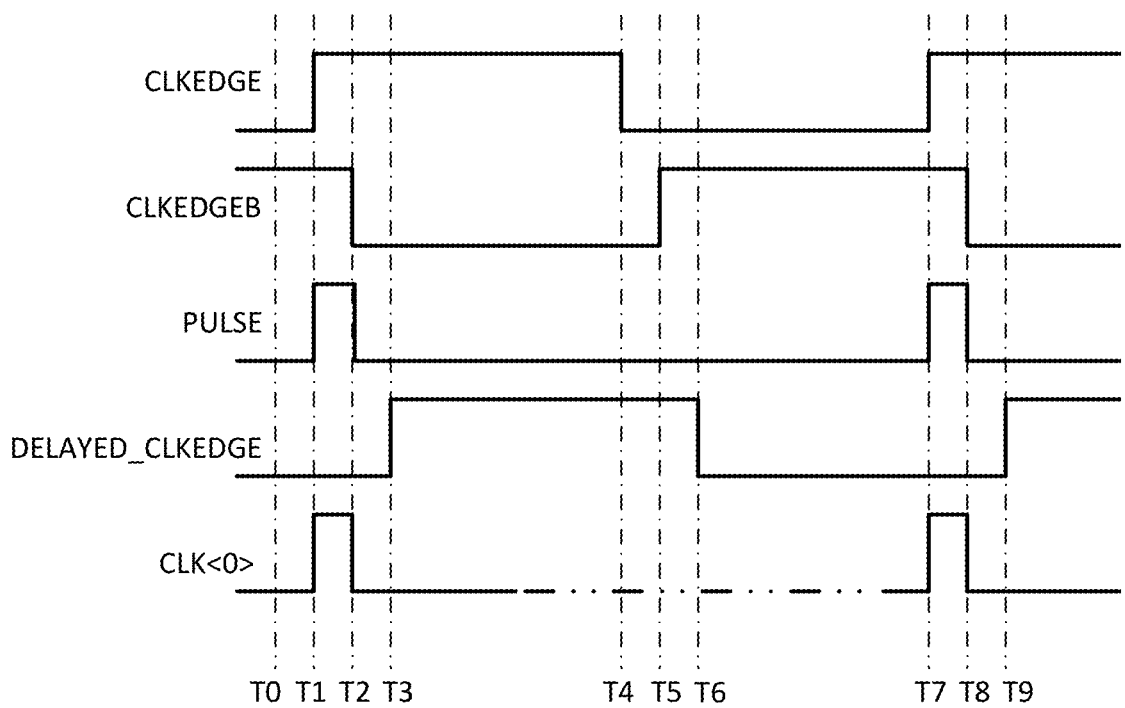
FIG. 2B is a timing diagram of operation of the clock edge extraction circuit and delay chain control circuit of FIG. 2A.

This is perhaps best understood with additional reference to the timing diagram of FIG. 2B. It can be seen that at time T0, CLKEDGE is still low, while CLKEDGEB is still high (because CLKEDGE has been low long enough to be inverted by the inverter 21). Therefore, the output of the AND gate (and thus PULSE) is low. At time T1, CLKEDGE rises high, but the inverter 21 has not yet had the time to pull its output (and thus CLKEDGEB) low. Therefore, AND gate 22 sees two logic highs at its input, so its output (PULSE) is pulled high between times T1-T2. PULSE goes low at time T2 because by time T2, the inverter 21 has been able to pull its output low in response to CLKEDGE being high.

Since DELAYED CLKEDGE is still low at time T1 when PULSE goes high, meaning that the multiplexer 27 selects its "0" input (corresponding to PULSE) for passage as CLK<0>, PULSE is injected into the delay chain 30 and therefore passed to the first delay chain element 30(1). At time T3, the inverter 26 has had the time to turn CLKEDGEB into a delayed version of CLKEDGE, which is shown as DELAYED CLKEDGE. Therefore, DELAYED CLKEDGE goes high at time T3, with the result being that the multiplexer 27 selects its "1" input, and therefore passes the output CLK<n> of the last delay chain element 30(n) to the first delay element 30(1) as input. This therefore means that the multiplexer 27 has "closed" the delay chain 30, causing the delay chain 30 to act as a ring buffer.

The up-counter 36, as stated, receives CLK<0> (the output CLK<n> of the last delay element 30(n) as passed by the multiplexer 27) as input, and counts each assertion of CLK<0> as PULSE circulates through the ring buffer formed from the delay chain 30. Therefore, the up-counter 36 counts the number of complete passes of PULSE through the ring buffer formed from the delay chain 30. When this count becomes equal to the most significant bits (MSBs) of the SEL word, SELMUX is asserted—stated another way, once PULSE has made a desired number of complete passes through the ring buffer formed from the delay chain 30, SELMUX is asserted.

When SELMUX is asserted, the multiplexer 37 passes the output CLK<0>, CLK<n> of a delay element 30(1), . . . , 30(n) indicated by the least significant bits (LSBs) of the SEL word as the delayed signal CLKOUT. Note that the multiplexer 37 does not continue to pass the output CLK<0>, CLK<n> of a delay element 30(1), . . . , 30(n), and returns to outputting a logic low once the up-counter 36 (and thus SELMUX) resets. This way, the same n elements of the delay chain 30 can be used to generated delays longer than n (assuming for simplicity that the delay provided by each delay element 30(1), . . . , 30(n) is 1/n), as output is not taken from the delay chain 30 until PULSE has made a desired number of complete passes through the ring buffer formed from the delay chain 30, and has then thereafter traveled through a desired number (less than n) of the delay elements 30(1), . . . , 30(n).

As an example, if n is 16, meaning that there are 15 delay elements in the delay chain 30 and one instance of the multiplexer 27 designed with the same delay as the delay element used in the delay chain 30, there will be 4 MSBs of the SEL word, 4 LSBs of the SEL word, and 16 delay chain outputs CLK<0>, CLK<15>. If a delay of 17 is desired, then SELMUX is asserted when CLK<1> has gone high twice (with the first logic high indicating that PULSE has entered the delay chain 30, and the second logic high indicating that PULSE has made one complete passage through the ring buffer formed from the delay chain 30), and the multiplexer 37 selects the output CLK<1> of the first delay chain element 30(1) to be passed as the delayed signal CLKOUT.

On the other hand, if a delay of 33 is desired, then SELMUX is asserted instead when CLK<1> has gone high three times (with the first logic high indicating that PULSE has entered the delay chain 30, the second logic high indicating that PULSE has made one complete passage through the ring buffer formed from the delay chain 30, and the third logic high indicating that PULSE has made two complete passages through the ring buffer formed from the delay chain 30), and the multiplexer 37 selects the output CLK<1> of the first delay chain element 30(1) to be passed as the delayed signal CLKOUT.

Note that CLKEDGE falls back low at time T4, with the result being that CLKEDGEB rises high at time T5. Since there is not an instance of CLKEDGE and CLKEDGB both being high here, PULSE remains low. At time T6, CLKEDGEB has had the time to propagate through inverter 26 to pull DELAYED CLKEDGE low, and therefore the multiplexer 27 will "reopen" the delay chain 30, and pass its "0" input (which will be PULSE) as the output to CLK<0>. As such, the total delay producible by the programmable delay chain 2 is limited only by the pulse width of CLKEDGE (since the pulse width of DELAYED CLKEDGE is equal to the pulse width of CLKEDGE), and is not limited by the number of delay elements 30(1), . . . , 30(n) in the delay chain 30.

The timing sequence previously described as occurring between times T1-T3 begins over at times T7-T9, with PULSE rising at time T7 to be injected into the delay chain 30, and the operation of the programmable delay line 2 proceeds as described above.

Note that a delayed clock signal can be easily reconstructed from the delayed signal CLKOUT, such as by using a divide by two counter or a toggle circuit.

As explained, the disclosed architecture reuses the delay units 30(1), . . . , 30(n) multiple times to achieve a larger delay than would otherwise be possible with a limited number of delay units. As noted earlier, the delay units 30(1), . . . , 30(n) are used in looping fashion and the ring buffer formed from the delay chain 30 by the multiplexer 27 is inherently stable due to the even number of delay elements in the loop. Compared to prior art designs, the number of delay elements used to produce a same delay is drastically reduced, which further reduces the amount of circuitry used in delay selection, thus reducing the implementation area, leakage power and process variability.

The disclosed programmable delay line 2 is therefore intuitively advantageous compared to the prior art. In addition to design simplicity, scalability and implementation, the advantages provided can be quantified in terms of area, power, timings and delay variations. The results have been benchmarked in 40 nm CMOS technology, such as that utilized by STMicroelectronics. Indeed, it has been found that the area used by a conventional programmable delay line is 8 times that of the programmable delay line disclosed herein. This advantage of the programmable delay line disclosed herein precipitates a major gain in terms of leakage power. In addition, simulation measurements at the worst power corner indicate a major leakage power reduction of the order of 10 compared to the prior art design.

Figure 3A:
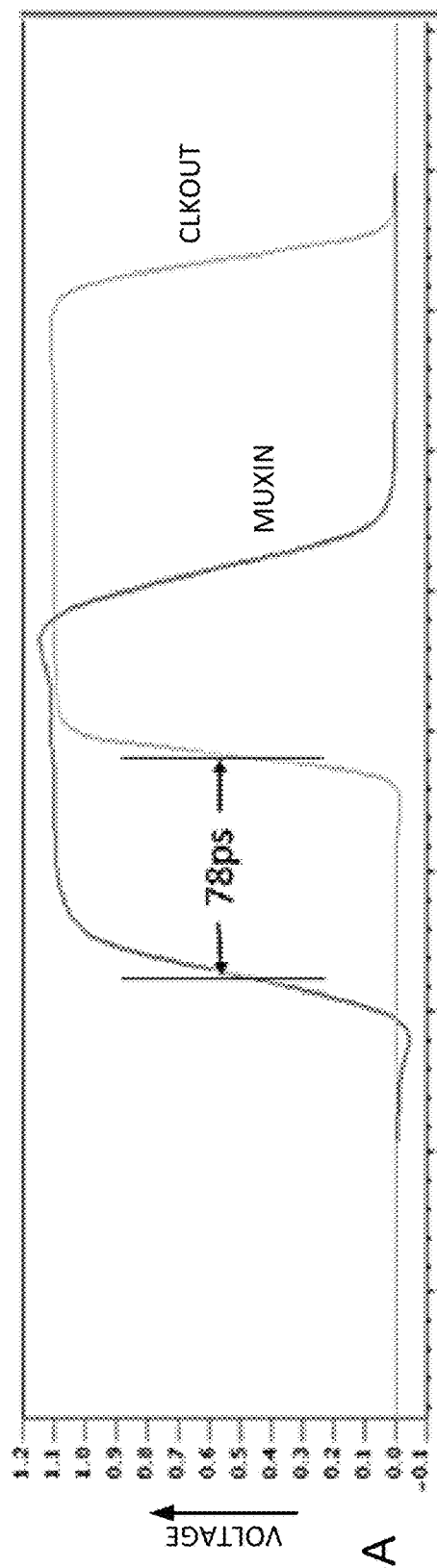
FIGS. 3A-3B show the delay of the output multiplexer of the programmable delay line of FIG. 2 compared to the output delay of the programmable delay line, versus the delay of the output multiplexer of the prior art compared to the output delay of the prior art.
Figure 3B:
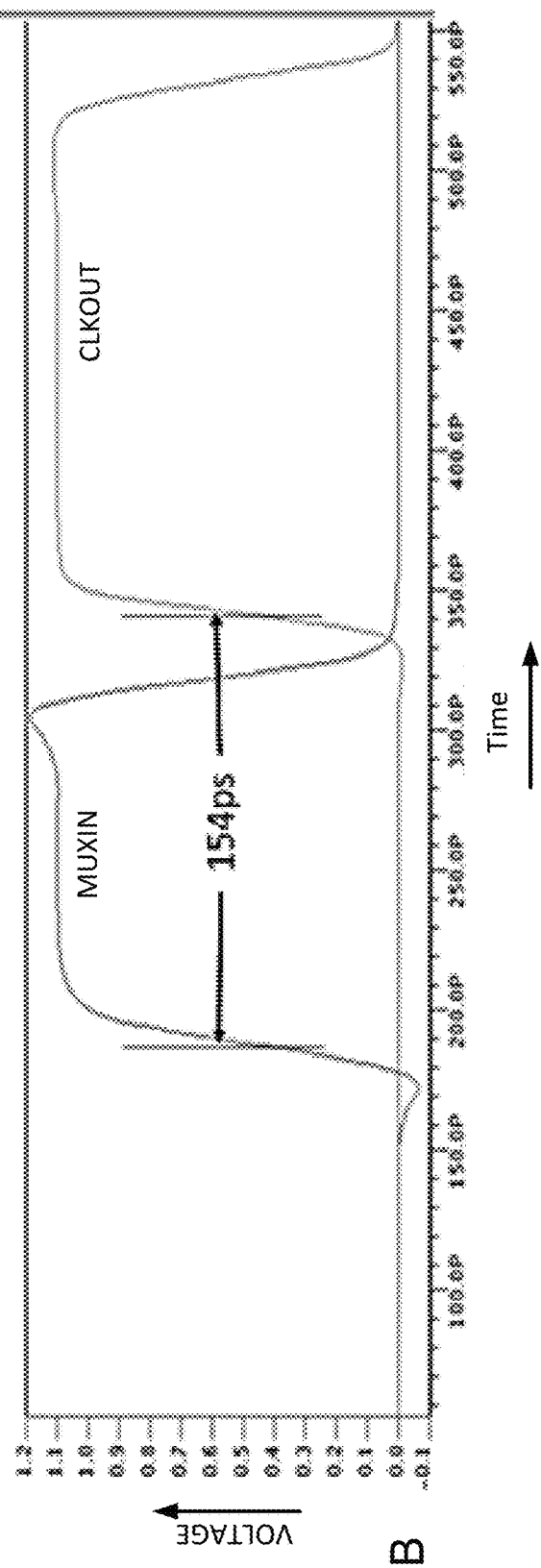

FIGS. 3A-3B show delay inherent to the multiplexer 37 of the disclosed design (FIG. 3A) compared to the prior art (FIG. 3B). The larger multiplexer from the prior art design contributes to a much larger delay (154 ps in FIG. 3B) compared to the much smaller delay (78 ps in FIG. 3A) of the programmable delay line disclosed herein. Therefore, absolute delay selectivity is improved.

By virtue of the programmable delay line disclosed herein using a lesser number of delay elements repeatedly, the changes in delay due to process/voltage/temperature variation are reduced. Referring to FIGS. 4A-4B, the delay mismatch between different points in the delay line are plotted for 10 Monte-Carlo runs. It is observed in FIG. 4A that with the programmable delay line disclosed herein, the delay variation is minimal across uniformly spaced delay elements (on the order of 1 ps) as opposed to the wide variation seen in the prior art programmable line seen in FIG. 4B (which is on the order of 15 ps). The delay predictability across PVT is thus greatly improved.

Table-I lists the above discussed metrics that portray multiple advantages of the disclosed programmable delay line with respect to the prior art.

TABLE I

Comparison of Figures of Merit

| | Conventional | Proposed | Gain |
|---|---|---|---|
| Area (in μm$^2$) | 1200 | 150 | 8 |
| Leakage Power (in uA) | 22.11 | 2.29 | 10 |
| MUX delay (in pS) | 154 | 78 | 2 |
| Delay variation (in pS) | 15 | 1 | 15 |

An advantageous programmable delay line is therefore presented in this disclosure where the design functionality is achieved with a lesser number of delay elements than used in the prior art, and a lesser amount of associated hardware compared to the prior art. A comparison with the prior art reveals significant gain in terms of area, leakage power, and variability. The programmable delay line disclosed herein can be automated in some instances, according to the desires of the application. The disclosed programmable delay line opens new possibilities in various domains that would normally be limited due to the sheer number of delay elements conventionally required.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A delay line, comprising:
a delay chain;
a pulse generator configured to generate a pulse in response to an edge of a received input signal;
a delay chain control circuit having a first input configured to receive the pulse from the pulse generator, a second input configured to receive an output from a last element of the delay chain, and a selection input configured to receive a delayed version of the received input signal, the delay chain control circuit having an output coupled to provide input to a first element of the delay chain in response to the delayed version of the received input signal; and
an output selection circuit configured to:
receive outputs from each element of the delay chain;
count a number of complete passages of the pulse through the delay chain; and
in response to the counted number being equal to a desired count, pass a desired one of the outputs of the elements of the delay chain as output.

2. The delay line of claim 1, wherein the pulse generator comprises:
a first inverter coupled to receive the received input signal and configured to generate a complement of the received input signal; and
an AND gate having a first input configured to receive the received input signal, a second input configured to receive the complement of the received input signal, and an output configured to generate the pulse.

3. The delay line of claim 1, wherein the delay chain control circuit comprises:
a first multiplexer having a first input configured to receive the pulse from the pulse generator, a second input configured to receive output from the last element of the delay chain, and a selection input configured to receive the delayed version of the received input signal, wherein the first multiplexer is configured to pass either the pulse or the output from the last element of the delay chain dependent upon a state of the delayed version of the received input signal.

4. The delay line of claim 1, wherein the desired count is based upon a first selection signal.

5. The delay line of claim 1, wherein the desired one of the outputs of the elements of the delay chain is based upon a second selection signal.

6. The delay line of claim 1, wherein the desired count is based upon most significant bits of a selection signal; and wherein the desired one of the outputs of the elements of the delay chain is based upon least significant bits of the selection signal.

7. The delay line of claim 6, wherein the selection signal sets a total delay of the received input signal provided by the delay chain.

8. The delay line of claim 1, wherein the output selection circuit comprises:
an up-counter configured to receive the output of the delay chain control circuit as input, the up-counter configured to count assertions of the output of the delay chain control circuit and assert a selection signal as output in response to the count being equal to the desired count; and
output selection logic having inputs configured to receive the output from each element of the delay chain as input, being triggered by assertion of the selection signal, and configured to pass the desired one of the outputs of the elements of the delay chain as output when triggered.

9. A method of generating a delay, the method comprising:
generating a pulse in response to an edge of a received input signal;
injecting the pulse into a delay chain in response to a delayed version of the received input signal having a second logic level;
injecting output of a last element of the delay chain into an input to a first element of the delay chain in response to the delayed version of the received input signal having a first logic level different than the second logic level;
counting a number of complete traversals of the pulse through the delay chain; and
in response to the counted number of complete traversals of the pulse through the delay chain being equal to a desired count, passing output from a desired element of the delay chain as an output signal.

10. The method of claim 9, further comprising providing a first selection signal representing the desired count.

11. The method of claim 9, further comprising providing a second selection signal representing the desired element of the delay chain.

12. The method of claim 9, further comprising setting the generated delay by setting the desired count and the desired element of the delay chain.

13. A delay line, comprising:
a first inverter configured to receive a clock edge and output a complement of the clock edge;
an AND gate having a first input configured to receive the clock edge, a second input configured to receive the complement of the clock edge, the AND gate configured to generate an AND output;
a delay chain containing a plurality of delay elements;
a second inverter configured to receive the complement of the clock edge and output a delayed clock edge;
a first multiplexer having a first input configured to receive the AND output, a second input configured to receive output from a last delay element of the delay chain, a control input configured to receive the delayed clock edge, and an output coupled to a first delay element of the delay chain;
an up-counter having an input coupled to the output of the first multiplexer, a control input coupled to a first select signal, and an output; and
a second multiplexer having a plurality of inputs respectively coupled to the plurality of delay elements, a control input configured to receive a second select signal, a trigger enable input coupled to the output of the up-counter, and an output configured to provide a delayed signal.

14. The delay line of claim 13, wherein the first select signal contains most significant bits of a selection word.

15. The delay line of claim 13, wherein the second select signal contains least significant bits of a selection word.

16. A delay line, comprising:
a delay chain;
a pulse generator configured to generate a pulse;
a delay chain control circuit having an input configured to receive output from a last element of the delay chain, the delay chain control circuit having an output configured to provide input to a first element of the delay chain; and
an output selection circuit configured to:
receive outputs from each of the elements of the delay chain;
count a number of complete passages of a pulse through the delay chain; and
pass a desired one of the outputs of the elements of the delay chain as output, based upon the counted number being equal to a desired count.

17. The delay chain of claim 16, wherein the desired count is based upon a first selection signal.

18. The delay chain of claim 17, wherein the desired one of the outputs of the elements of the delay chain is based upon a second selection signal.

19. The delay chain of claim 16, wherein the desired count is based upon most significant bits of a selection signal; and wherein the desired one of the outputs of the elements of the delay chain is based upon least significant bits of the selection signal.

20. The delay chain of claim 19, wherein the selection signal sets a total delay by the delay chain.

21. The delay chain of claim 16, wherein the output selection circuit comprises:
an up-counter configured to receive the output of the delay chain control circuit as input, the up-counter configured to count assertions of the output of the delay chain control circuit and assert a selection signal as output in response to the count being equal to the desired count; and
an output selection circuit having inputs configured to receive the output from each element of the delay chain as input, being triggered by assertion of the selection signal, and configured to pass the desired one of the outputs of the elements of the delay chain as output when triggered.

22. A method of generating a delay, comprising:
injecting a pulse into a delay chain;
injecting output of a last element of the delay chain into an input of a first element of the delay chain;
counting a number of complete traversals of the pulse through the delay chain; and
in response to the counted number of complete traversals of the pulse through the delay chain being equal to a desired count, passing output from a desired element of the delay chain as an output signal.

23. The method of claim 22, further comprising providing a first selection signal representing the desired count.

24. The method of claim 23, further comprising providing a second selection signal representing the desired element of the delay chain.

25. The method of claim 22, further comprising setting the generated delay by setting the desired count and the desired element of the delay chain.

* * * * *